United States Patent
Daneman et al.

(10) Patent No.: US 10,696,547 B2
(45) Date of Patent: Jun. 30, 2020

(54) MEMS CAVITY WITH NON-CONTAMINATING SEAL

(71) Applicant: SiTime Corporation, Santa Clara, CA (US)

(72) Inventors: Michael Julian Daneman, Campbell, CA (US); Charles I. Grosjean, Los Gatos, CA (US); Paul M. Hagelin, Saratoga, CA (US)

(73) Assignee: SiTime Corporation, Sunnyvale, CA (US)

( * ) Notice: Subject to any disclaimer, the term of this patent is extended or adjusted under 35 U.S.C. 154(b) by 0 days.

(21) Appl. No.: 15/897,135

(22) Filed: Feb. 14, 2018

(65) Prior Publication Data
US 2018/0257929 A1 Sep. 13, 2018

Related U.S. Application Data

(60) Provisional application No. 62/459,017, filed on Feb. 14, 2017.

(51) Int. Cl.
*B81C 1/00* (2006.01)
*B81B 7/00* (2006.01)

(52) U.S. Cl.
CPC ........ *B81C 1/00293* (2013.01); *B81B 7/0041* (2013.01); *B81B 2201/0271* (2013.01); *B81B 2201/032* (2013.01); *B81C 2203/0145* (2013.01)

(58) Field of Classification Search
None
See application file for complete search history.

(56) References Cited

U.S. PATENT DOCUMENTS

| 2008/0079142 | A1  | 4/2008  | Carmona et al. |
| 2009/0050988 | A1  | 2/2009  | Suzuki et al. |
| 2012/0256308 | A1* | 10/2012 | Helin .................. B81C 1/00333 257/704 |
| 2015/0123217 | A1  | 5/2015  | Reinmuth et al. |
| 2015/0344301 | A1* | 12/2015 | Kinugawa ............. B81B 7/0064 257/419 |
| 2016/0023888 | A1  | 1/2016  | Quevy et al. |
| 2016/0130137 | A1* | 5/2016  | Huang ...................... B81B 7/02 257/415 |
| 2018/0148318 | A1* | 5/2018  | Flynn .................... B81B 7/0019 |

FOREIGN PATENT DOCUMENTS

EP     1460038 A2     9/2004

OTHER PUBLICATIONS

International Search Report and Written Opinion of International Search Authority in International Application No. PCT/US2018/018261, dated Aug. 5, 2018, 13 pages.

\* cited by examiner

*Primary Examiner* — Nilufa Rahim

(57) ABSTRACT

A semiconductor device includes a first silicon layer disposed between second and third silicon layers and separated therefrom by respective first and second oxide layers. A cavity within the first silicon layer is bounded by interior surfaces of the second and third silicon layers, and a passageway extends through the second silicon layer to enable material removal from within the semiconductor device to form the cavity. A metal feature is disposed within the passageway to hermetically seal the cavity.

21 Claims, 6 Drawing Sheets

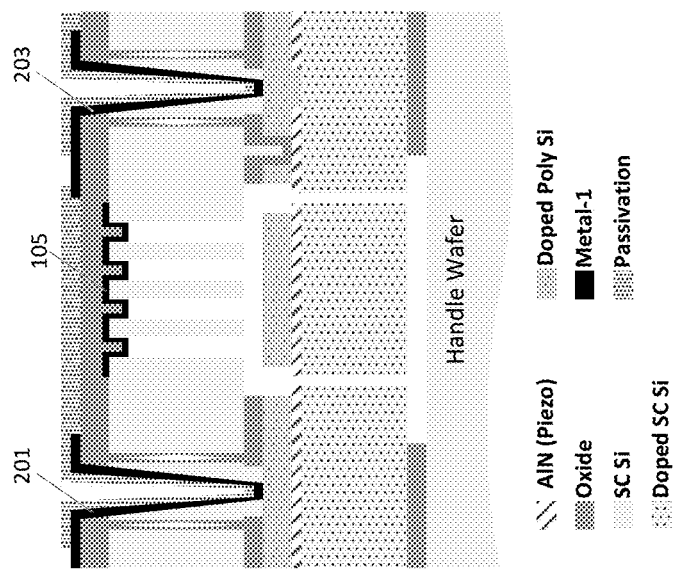
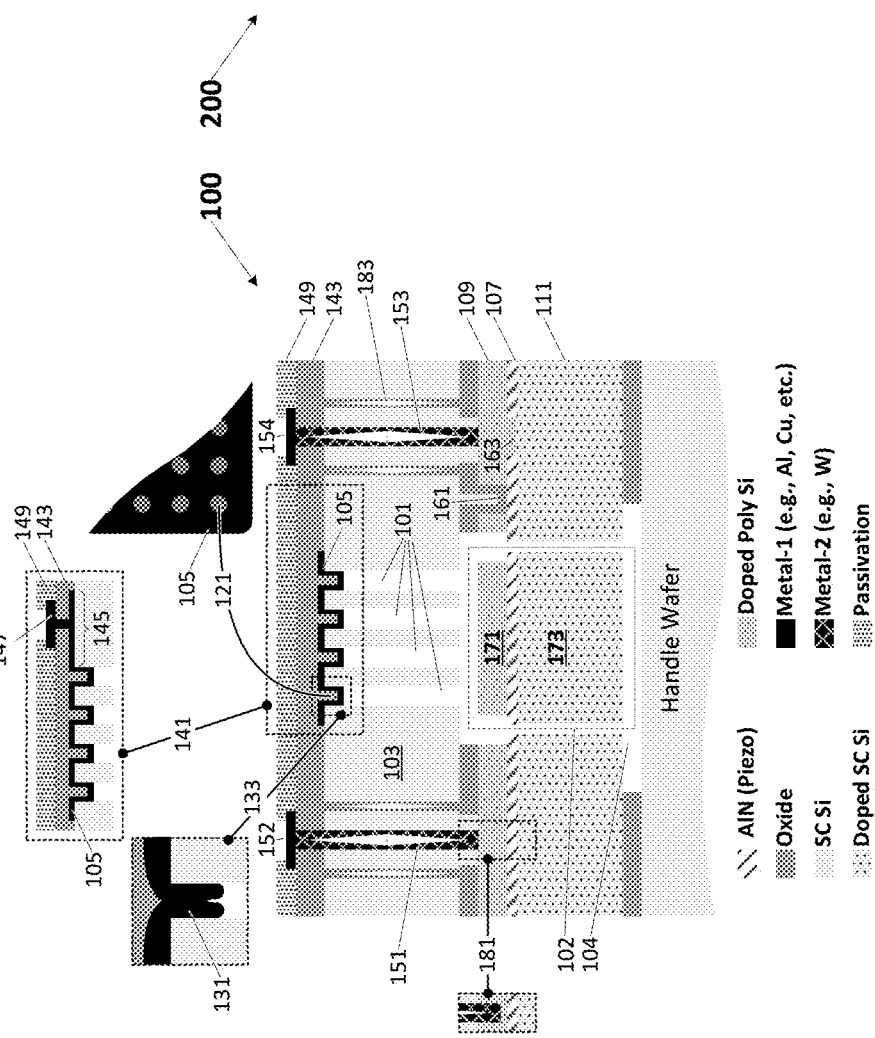

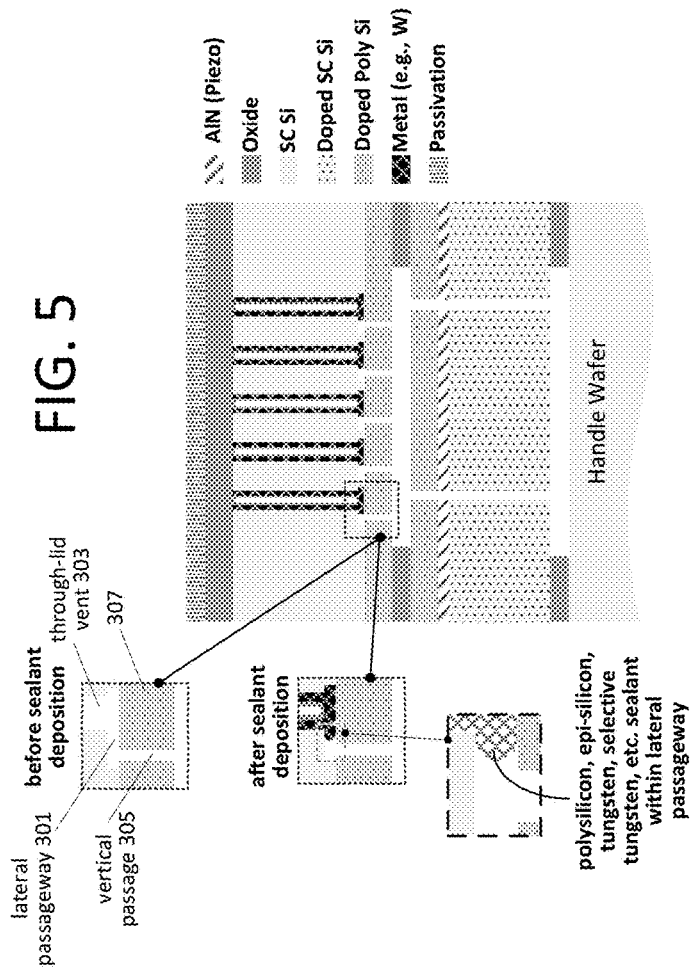
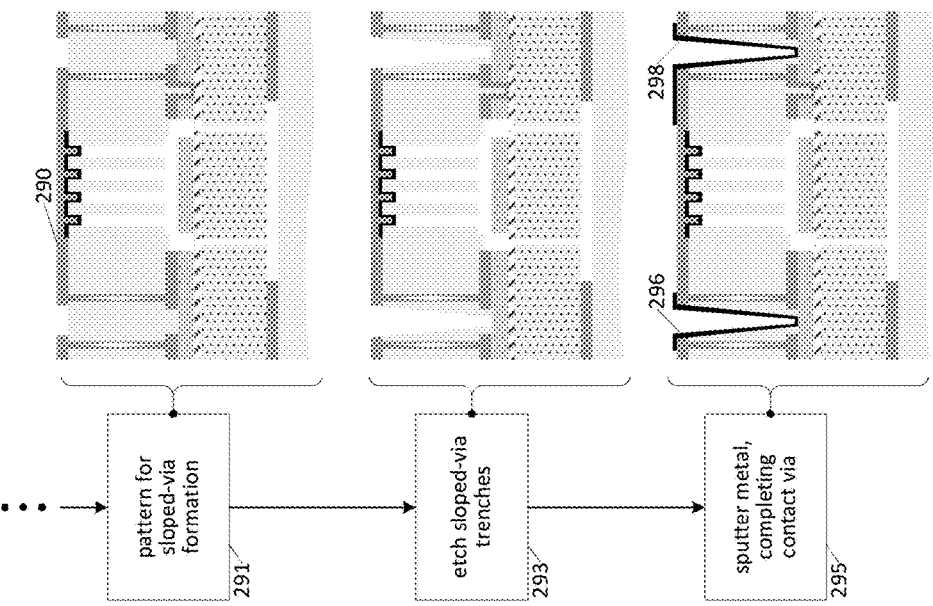

MEMS CAVITY WITH NON-CONTAMINATING SEAL

CROSS-REFERENCE TO RELATED APPLICATIONS

This application hereby claims priority to and incorporates by reference U.S. Provisional Patent Application No. 62/459,017 filed Feb. 14, 2017 ("Sealed MEMS Cavity with Plugged Etch-Vents and Metal Vias").

TECHNICAL FIELD

The disclosure herein relates to microelectromechanical systems (MEMS).

INTRODUCTION

MEMS structures are conventionally sealed in a low-pressure or controlled-pressure chamber through growth of an epitaxial silicon lid, a high-temperature deposition process that may degrade temperature-sensitive materials and/or result in undesired deposition in emerging MEMS solutions.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of a MEMS device in which oxide-release vents are sealed via metal-seal deposition at vent openings in a silicon lid-layer;

FIG. 2 illustrates an embodiment of a MEMS device having metal-sealed oxide-release vents and tapered contact vias;

FIG. 4 illustrates an exemplary fabrication process with respect to the MEMS embodiment of FIG. 2;

FIGS. 5 and 6 illustrate alternative embodiments in which oxide in a MEMS cavity is released through relatively small capillary passageways extending between the MEMS cavity and larger through-lid vents;

Figure 7:
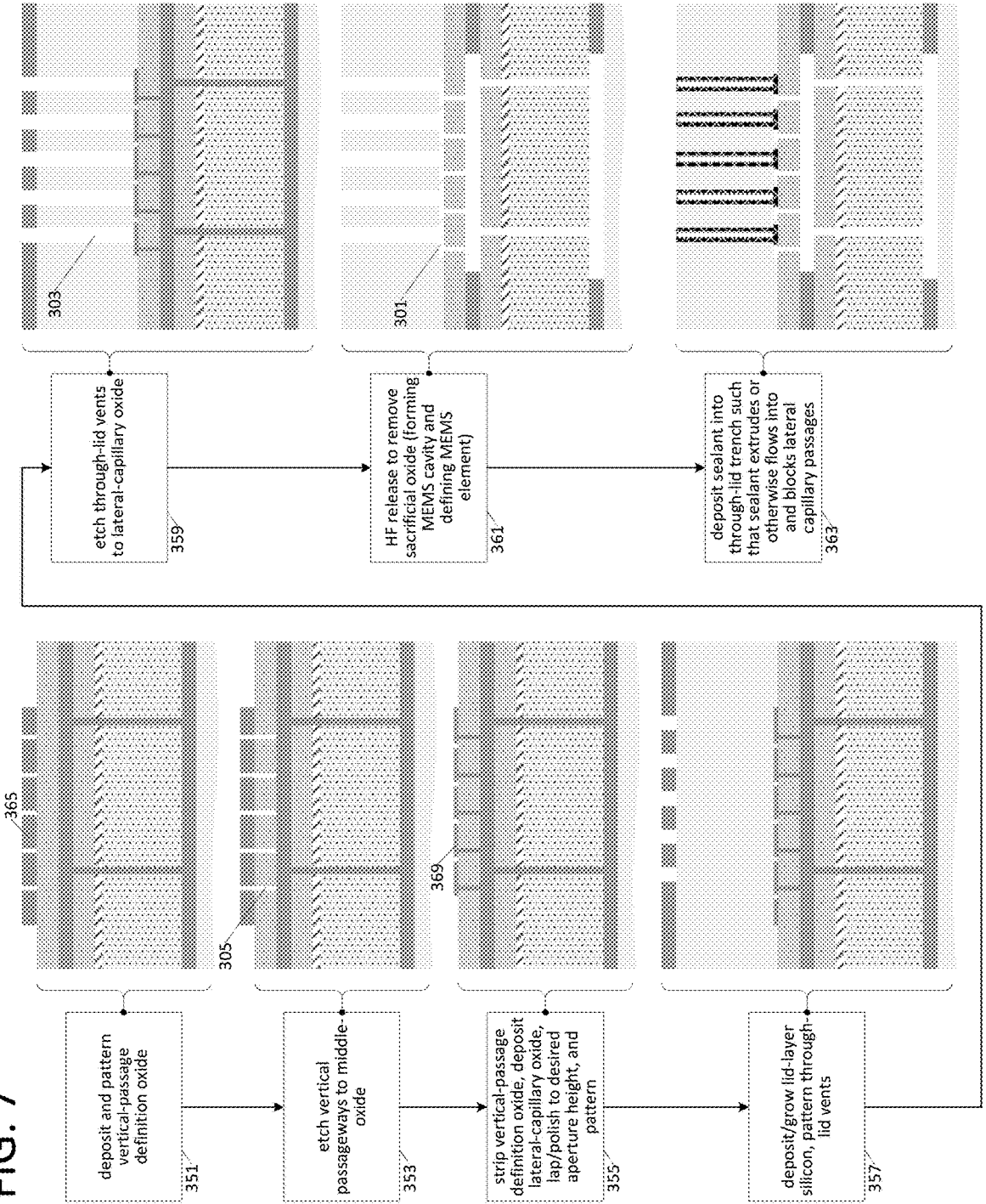
Figure 8:
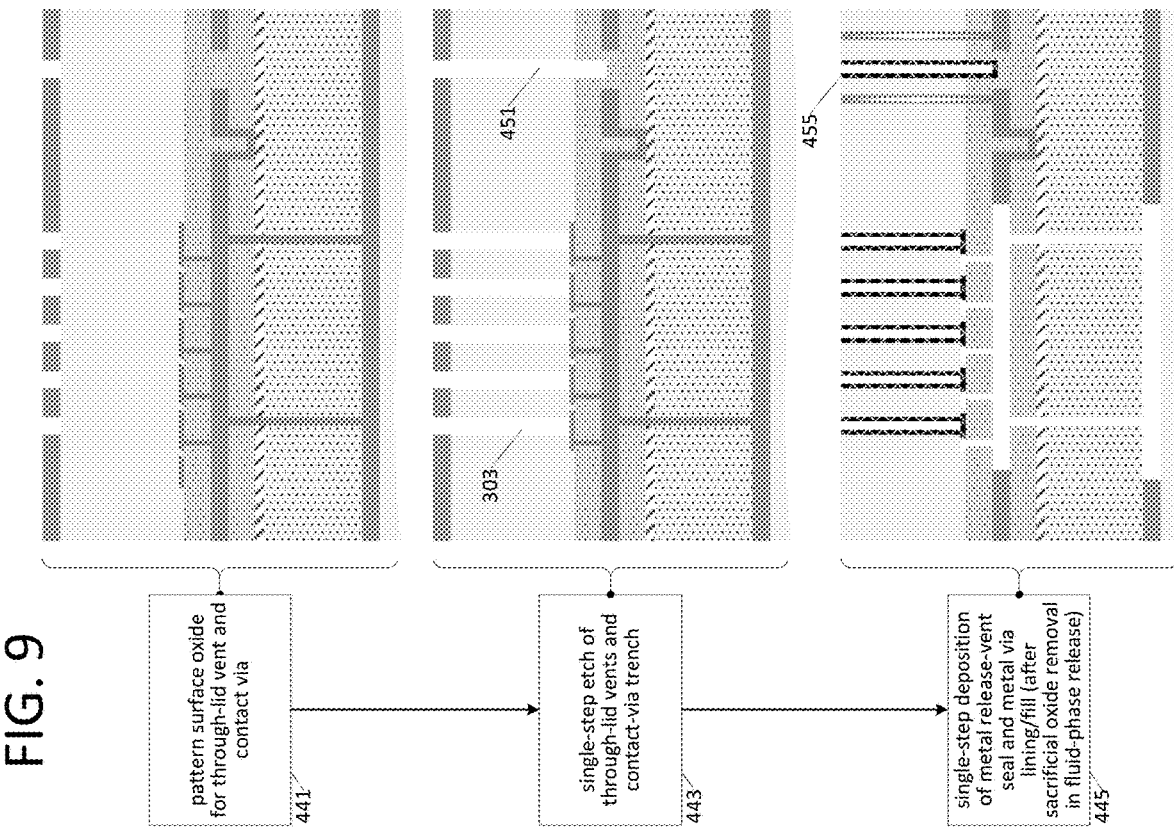
Figure 9:
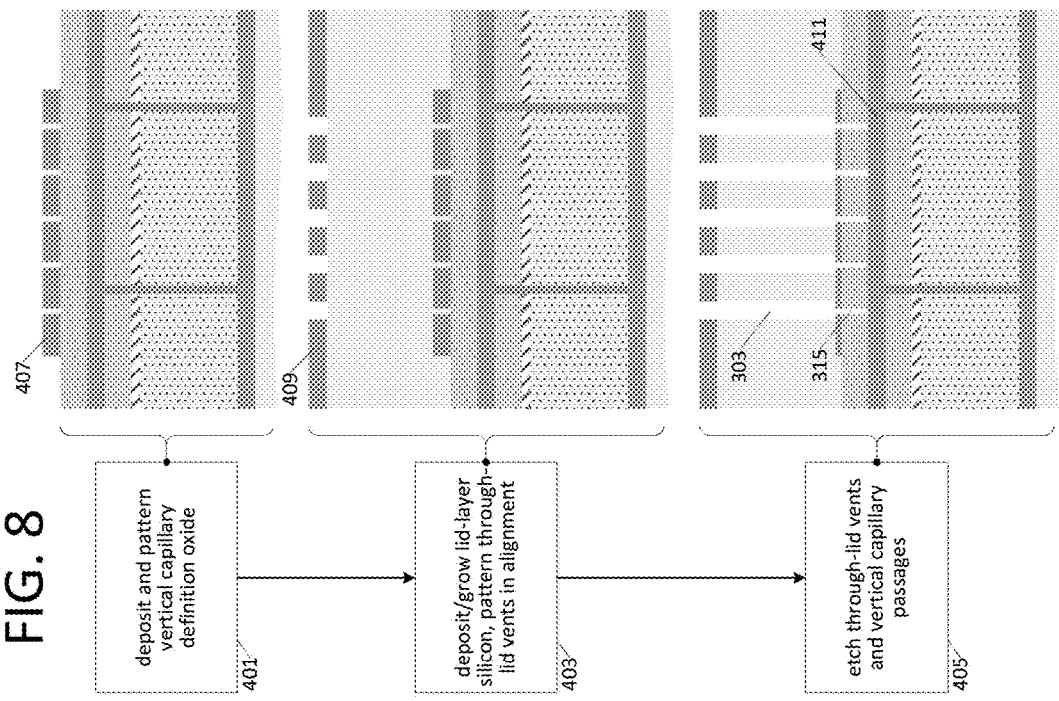
Figure 11:
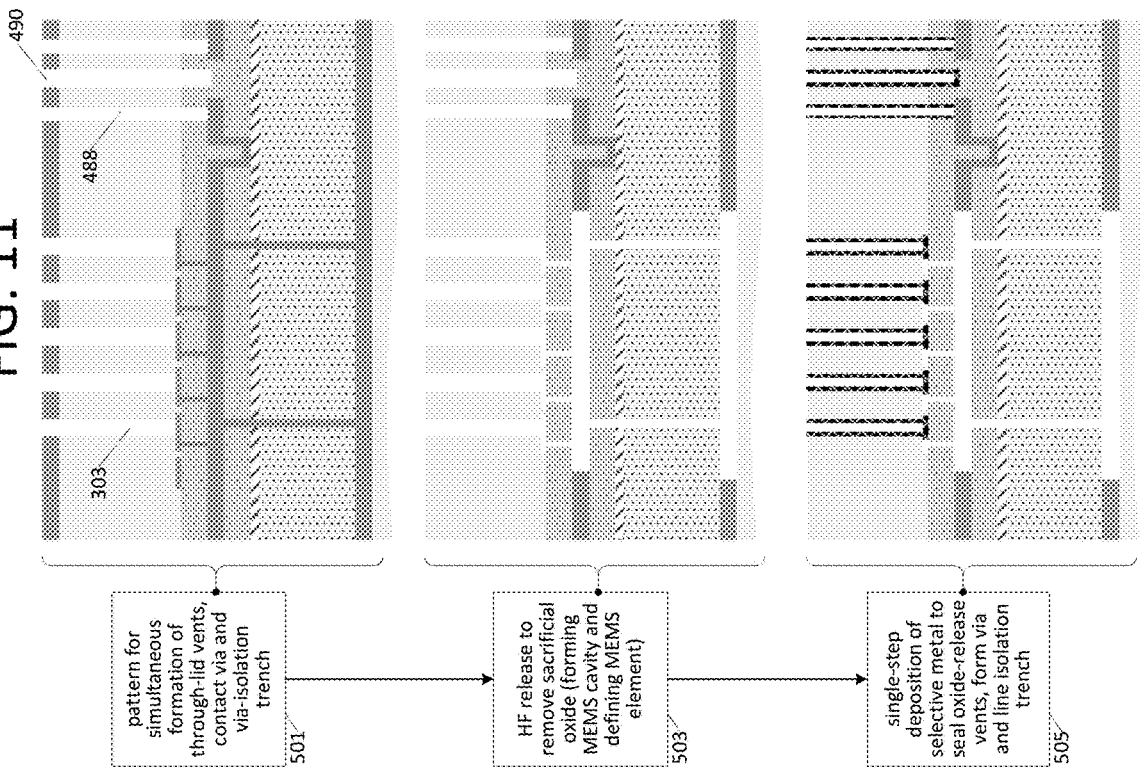
Figure 10:
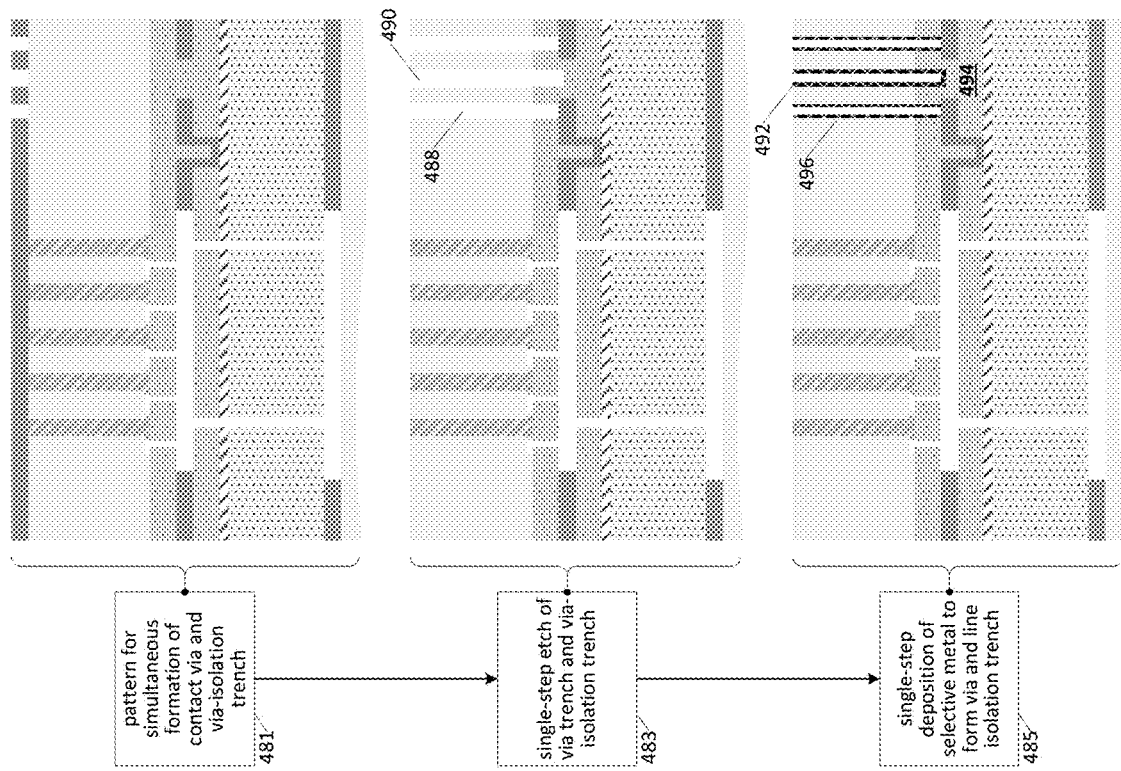

FIGS. 7 and 8 illustrate exemplary fabrication processes corresponding to the narrow-passageway oxide-release vents shown in FIGS. 5 and 6, respectively; and FIGS. 9-11 illustrate examples of process efficiency achieved through concurrent feature formation with respect to the capillary oxide-vent embodiments of FIGS. 5 and 6.

DETAILED DESCRIPTION

In various embodiments disclosed herein, vents through which an etchant enters to remove sacrificial oxide and thereby define (release) a MEMS element are plugged through strategic material deposition without the high process temperatures and/or inadvertent material depositions associated with conventional epitaxial lid formation. In a number of embodiments, for example, oxide-release vents formed within a silicon lid layer are plugged by metal deposition (e.g., sputtered, evaporated or chemical-vapor-deposited (CVD) metal) at less than half the temperature typically required by epitaxial silicon growth, permitting application with thermally sensitive thin piezo-electric films (e.g., aluminum-nitride) and/or avoiding undesired material deposition onto (or roughening or other degrading of) such films or other material layers. In other embodiments, oxide-release vents are formed with relatively narrow lateral passageways that avoid line-of-sight access into the MEMS chamber and/or narrow vertical passageways that, in either case, may be plugged with no or negligible sealant deposition within the MEMS chamber. In yet other embodiments, process efficiencies are realized through concurrent formation of oxide-release vents, contact-via trenches and isolation trenches (or any subset thereof), and/or concurrent disposition of material(s) within such trenches and release vents.

FIG. 1 illustrates an embodiment of a MEMS device 100 in which oxide-release vents 101 are sealed (plugged, blocked, closed-off, etc.) via metal-seal deposition (105) at vent openings in silicon lid-layer 103. In general, metal seal 105 is formed by metal sputtering (e.g., copper (Cu) or aluminum—any practical metal/metal-alloy and deposition process may be used) at a temperature less than 400 degrees Celsius (° C.) and thus less than half the temperature required (typically above 1000° C.) for silicon epitaxy. In the exemplary piezo-actuated MEMS resonator device shown, sealing oxide-release vents 101 through low-temperature metal deposition avoids degrading (damaging, destroying) heat-intolerant piezoelectric layer 107 (e.g., aluminum nitride or lead-zirconium-titanate, though other piezoelectric materials may be used) and also avoids undesired sealant deposition on the doped polysilicon electrode layer 109 and piezoelectric layer 107 which may otherwise degrade those materials (e.g., erode or roughen the polysilicon) and/or bridge the void between the MEMS resonator 102 and surrounding field area (resulting in electrical short-circuit, mechanical disruption, etc.). In other embodiments, including those lacking heat-intolerant material layers (e.g., electrostatically actuated MEMS resonators, MEMS accelerometer masses, MEMS thermistors, etc.), oxide-release vents 101 and lid-silicon metal seal 105 may be strategically positioned to avoid sealant intrusion into the MEMS chamber (i.e., cavity 104, again avoiding undesired mechanical disruption or electrical short-circuit. Accordingly, while the exemplary piezo-actuated resonator structure shown in FIG. 1 (piezoelectric layer sandwiched between doped single-crystal silicon and doped polysilicon) is carried forward in various examples herein, the oxide-vent sealing structures and processes may, in all cases, be applied with respect to MEMS structures formed from other material stacks, single-layer structures (e.g., MEMS resonators or other structures constituted by a single material layer) and multi-layer structures that lack a piezoelectric material layer and/or doped or conductive material layer.

Still referring to FIG. 1, oxide-release vents 101 may be specifically sized (i.e., aperture with specific cross-sectional area as shown by the exemplary circular geometry in top-view 121) to enable a desired metal ingress/fill as shown by the sealed region 131 in detail view 133. For example (and without limitation), in sputtered-metal seal implementations (e.g., Cu, Al, etc.), vent/aperture diameter (or cross-sectional area) may be defined by lithographic patterning to yield a dimension of less than 2 microns (μm) and a depth-to-width aspect-ratio of 5 or greater. Further, the metal vent cover (vent cap) may be electrically coupled to an electrical contact (e.g., a ground contact) as shown in detail view 141. In that case, a relatively shallow electrical via may be formed through surface oxide 143 to interconnect vent seal 105 (which may include a lateral extension 145 for that purpose) with metal contact feature 147, itself exposed through an opening in passivation layer 149.

In the FIG. 1 embodiment, electrical vias 151 and 153 extend through the lid-layer silicon 103 to contact subsurface structures (e.g., MEMS resonator drive/sense electrode(s), MEMS resonator-bias electrode(s), thermistor terminals, MEMS accelerometer-mass bias/sense electrodes, etc.). In the specific piezo-actuated resonator implementation shown, polysilicon layer 109 and device-layer single-crystal silicon 111 are sufficiently doped (e.g., degenerately doped) to serve as electrical conductors, so that via 151 extends from a surface contact 152 to a first actuation electrode in polysilicon layer 109 while via 153 extends from surface contact 154 to a second actuation electrode in single-crystal silicon layer 157 (i.e., formed by interconnection of a region of polysilicon layer 109 isolated by oxide-lined channel 161 to single-crystal silicon layer 107 through opening 163 in piezoelectric layer 107). Though not specifically visible in the depicted cross-section, the region of polysilicon layer 109 contacted by via 151 is continuous with respect to polysilicon feature 171 in the material stack of resonator 102 (e.g., continuous by virtue of a tethering structure that connects/anchors the otherwise released MEMS resonator 102 to the surrounding/field area of the device), while single-crystal silicon region contacted by via 153 (through piezoelectric layer opening 163) is likewise contiguous with respect to single-crystal silicon layer 173 in the resonator material stack, meaning that contacts 152 and 154 are electrically coupled to regions 171 and 172, respectively, and thus to electrodes on either side of piezoelectric region 107 within MEMS resonator 102. Accordingly, a time-varying potential may be applied across contacts 152 and 154 to produce corresponding time-varying piezoelectric expansion and contraction of resonator piezoelectric layer to drive resonator 102 into mechanical resonance in one or more modes (e.g., extensional, flexural, shear, breathmode, etc.). As discussed, other contacts and corresponding vias may be provided to effectuate resonator bias, device grounding, etc., and the contacts/vias shown may be used to convey signals and voltages other than resonator actuation signals (e.g., signals indicative of resonant motion, resistance of MEMS thermistor element, relative position of MEMS element within cavity 104, etc.).

While vias 151 and 153 are depicted as trench-isolated conductors (i.e., metal such as tungsten (W) or selective tungsten extending through a trench between contact 152/154 and polysilicon layer 109—and optionally into polysilicon layer 109 as shown at 181—and electrically isolated by an oxide-filled barrel-trench 183), various other via structures may be implemented in alternative embodiments. In MEMS device embodiment 200 of FIG. 2, for example, vias 201 and 203 are formed by sputtered metal deposition on a sloped-wall trench—an approach that avoids the need for separate metal types/processes with respect to metal vent cover (seal) 105 and metal vias 201/203 (both may be implemented, for example, by the same sputtered metal). All the variations discussed above with respect to metal vent seal 105 apply equally in the embodiment of FIG. 2 and, more generally, vias formed as shown in FIG. 1 or 2 may be implemented with different vent-seal materials and/or processes, including narrow-passage epitaxial silicon vent seals as discussed below.

Figure 3:
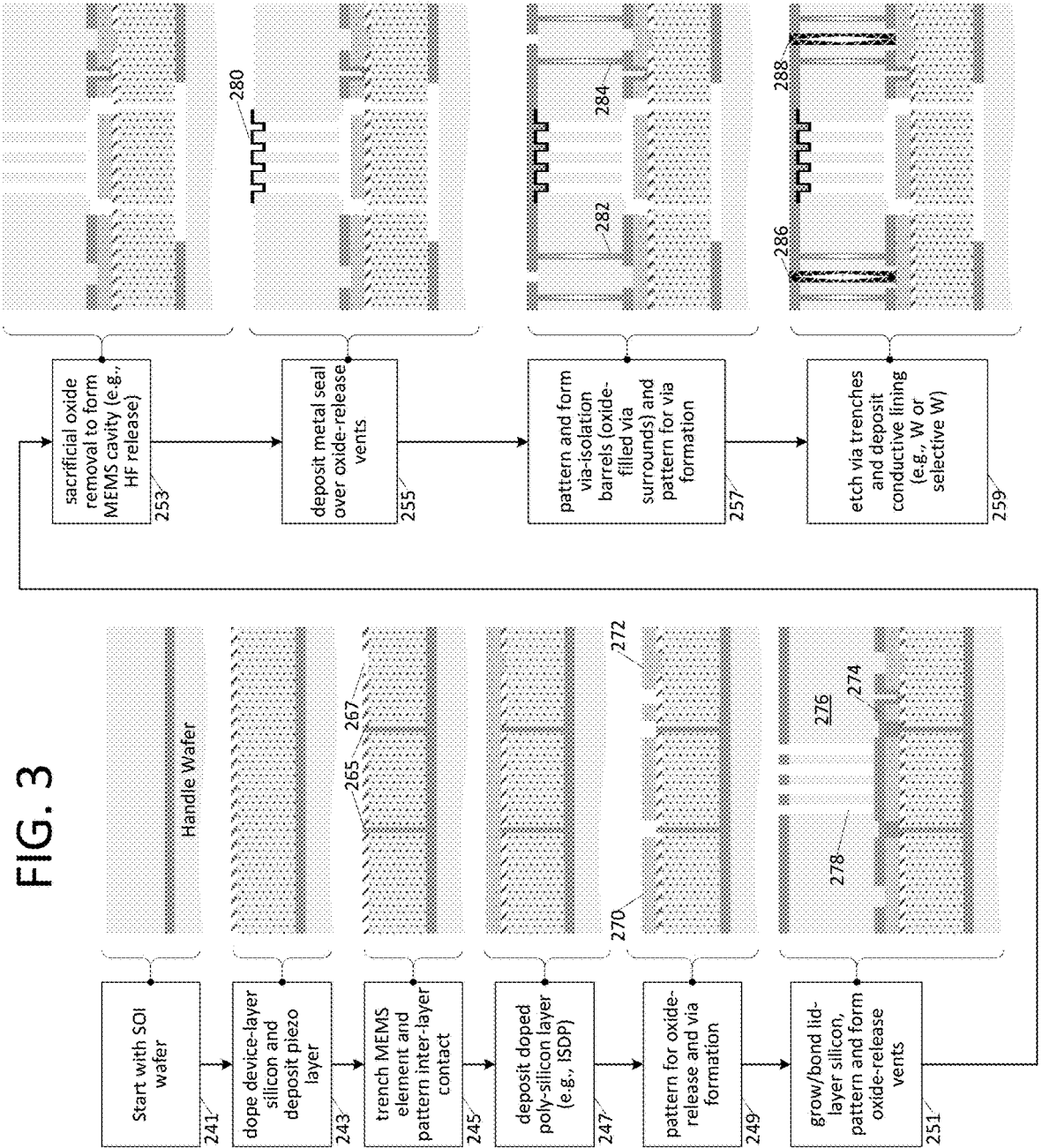
FIG. 3 illustrates an exemplary fabrication process with respect to the MEMS embodiment of FIG. 1.

FIG. 3 illustrates an exemplary fabrication process with respect to the MEMS embodiment of FIG. 1. Starting from a silicon-on-insulator (SOI) structure at 241 (i.e., buried oxide sandwiched between single-crystal-silicon handle layer and single-crystal-silicon device layer), device-layer silicon is doped to a desired level (e.g., degenerately doped with an n-type impurity concentration of at least $1E19/cm^3$ in at least one embodiment) followed by deposition of piezoelectric layer at 243 (e.g., aluminum nitride (AlN), though other piezoelectric materials may be used). At 245, a trench 265 that defines the MEMS element (e.g., outlines MEMS resonator) is formed through dielectric layer and doped silicon layer (i.e., trench extending to the buried oxide, separating that resonator from surrounding sidewalls of the silicon device layer) and filled with sacrificial oxide, and a through-dielectric contact region 267 is patterned. Doped polysilicon is deposited at 247, then patterned at 249 to segregate contact regions 270 and 272 and prepare for eventual oxide release and conductive via formation. At 251, over-poly oxide layer 274 is deposited and patterned for contact formation, followed by deposition of lid-layer silicon 276 (e.g., deposited epitaxially, through wafer-bonding, etc.), patterning for release vent formation and then etching to form oxide-release vents 278. Hydrofluoric acid (HF) release or other oxide release is executed at 253 (e.g., generally a vapor etch using a bubbled hydrofluoric acid solution or anhydrous hydrofluoric acid gas, though any fluid-phase (gas/vapor or liquid) release-etch may be employed) to form the MEMS cavity, followed at 255 by deposition of metal seal 280 to seal the oxide-release vents—an operation carried out, for example, at relatively low temperature (less than 400° C. in a number of sputtered metal processes) and without problematic material deposition within the MEMS cavity. At 257, via-isolation barrels 282 and 284 are patterned, etched and filled with oxide, followed by surface oxide deposition and contact-via patterning. Via trenches are etched and lined (or filled with) conductive material at 259 (e.g., tungsten or selective tungsten, the latter depositing on single-crystal or polycrystalline silicon, but not oxide) to finish conductive vias 286 and 288—structures that may thereafter be overlaid with contact metal, followed by passivation to yield the FIG. 1 embodiment.

FIG. 4 illustrates an exemplary fabrication process with respect to tapered-via MEMS embodiment of FIG. 2—after oxide-release and release-vent sealing operations (e.g., as shown at 253 and 255 in FIG. 3) have been completed and via-isolation barrels have been formed. Surface oxide 290 is patterned (291) in preparation for tapered-via formation, followed by etching of sloped via trenches at 293. Metal is deposited at 295 (e.g., through sputtering) to complete contact vias 296 and 298, followed by passivation to yield the FIG. 2 embodiment.

FIGS. 5 and 6 illustrate alternative embodiments in which oxide in the MEMS cavity is released through relatively small capillary passageways extending between the MEMS-element cavity and larger through-lid vents; passageways sufficiently narrow (constricted) to be closed off with relatively small sealant volume and to prevent propagation of vent sealant into the MEMS cavity itself.

In the embodiment of FIG. 5, the oxide-release path includes relatively narrow (high aspect-ratio) lateral passageways 301 that extend between through-lid vents 303 and vertical pathways 305 (the latter extending to/into the cavity through doped polysilicon layer 307 in this example) along respective axes substantially orthogonal to extensional axes of the passages they interjoin (i.e., vents 303 and vertical pathways 305)—a geometry that lacks line-of-sight passage from the lid-layer vent opening to the MEMS cavity and thus no straight-line path for undesired vent-sealant deposition into the MEMS cavity (i.e., vents 303 and pathways 305 extend/are routed along non-concentric parallel axes). Also, while the minimum aperture-size/aspect-ratio of through-lid vents 303 is generally constrained by requirements of the relatively deep etch through the silicon lid layer, lateral passageways 301 may be implemented with significantly smaller aperture height (e.g., less than 200 nanometers, or less than 100 nanometers) or higher length-to-aperture aspect ratio (e.g., as small as 9:1). Accordingly, lateral passageways 301 are readily plugged by various materials deposited to line or fill the through-lid trench including, without limitation, polysilicon, epitaxial silicon, tungsten, selective tungsten and so forth. Moreover, in the case of epitaxial silicon deposition, temperatures may be reduced relative to those effected by less restrictive (larger aperture) release vents, avoiding (or at least mitigating) degradation of temperature susceptible material layers. In any case, sealant material deposited into the through-lid vent paths extrudes (or otherwise flows) into the lateral-passageways, blocking those capillaries to hermetically seal the MEMS cavity.

In the embodiment of FIG. 6, narrow, small-aperture passageways 315 are formed vertically directly beneath the larger-aperture through-lid vents—a capillary "straw" approach that exposes line-of-sight access into the MEMS cavity in return for potentially simplified fabrication. That is, each passageway 305 extends (is routed) along an axis through which the adjoined through-lid vent also extends—a shared axis that may or may not be concentric with respect to either segment of the collective pathway. As in the embodiment of FIG. 5, narrow (capillary) passageways 315 are dimensioned to permit fluid-phase oxide removal while limiting through-passage of sealant material (e.g., tungsten, selective tungsten, polysilicon, epitaxial silicon, etc.), permitting sufficient ingress into the capillary to seal the oxide-release vent without (or with negligible) sealant entry into the MEMS cavity.

Still referring to FIG. 6, the leftmost capillary passageway 315 and corresponding through-lid vent are positioned over the field area of the MEMS device and not over the MEMS cavity itself. This arrangement may further reduce propagation of sealant into the MEMS cavity and may be applied with respect to any or all the oxide-release vents in the FIG. 6 embodiment. More generally, over-field-area release-vent placement may be implemented with respect to any of the embodiments presented herein—that is, any or all oxide-release vents or component passages thereof may be disposed over the field area in such embodiments (e.g., outside the perimeter defined by the trench through the device-layer silicon) instead of over the MEMS cavity.

FIGS. 7 and 8 illustrate exemplary fabrication processes corresponding to the narrow-passageway oxide-release vents shown in FIGS. 5 and 6, respectively. Starting at 351 in FIG. 7, vertical-passage definition oxide 365 is deposited (in this case over doped polysilicon) and patterned, followed by vertical passageway etch at 353. In the depicted embodiment, the vertical passageways (305) are themselves dimensioned as capillary (narrow aperture, high aspect ratio) passages, though larger-aperture vertical passageways may be implemented. At 355, the vertical-passage definition oxide is stripped followed by deposition, an optional back-grind (or lap, polish or other practicable planarizing ablation) and patterning of lateral-capillary oxide 369 to yield a desired lateral capillary passage height. At 357, lid-layer silicon is deposited (e.g., wafer bond, epitaxial growth, etc.) followed by deposition of sacrificial surface oxide and patterning for ensuing etch at 359 to form through-lid vents 303. Vapor-phase or liquid-phase oxide release (e.g., vapor-phase HF release) is carried out at 361 to remove sacrificial oxide, including the lateral-capillary oxide (leaving lateral capillary passages 301), vertical-passage oxide and sacrificial oxides within the MEMS cavity. At 363, vent-sealant material (e.g., tungsten, selective tungsten, polysilicon, epitaxial silicon, etc.) is deposited into the through-lid vents, extruding (or otherwise flowing) into and hermetically sealing the lateral capillary passageways (and thus sealing the MEMS cavity).

Turning to the capillary-straw formation in FIG. 8, vertical-capillary definition oxide 407 is deposited (in this case over doped polysilicon) and patterned to yield a desired capillary aperture dimension at 401. Though not specifically shown, capillary definition oxide 407 may be back-ground (lapped, polished, etc.) to enable reduced aperture dimension relative to that achievable through thicker oxide layers. In any case, lid-layer silicon is deposited at 403, followed by deposition and patterning of surface oxide 409 to enable formation of through-lid vents axially aligned (or otherwise disposed in line) with apertures in capillary definition oxide 407. Accordingly, deep-trench etching at 405 yields through-lid vents 303 in alignment with capillary passages 315 to interstitial oxide 411. Fluid-phase oxide release may be carried out thereafter to remove sacrificial oxide and form the MEMS cavity followed by sealant deposition into the lid-layer trenches to seal the vertical capillary passages as shown in FIG. 6.

FIGS. 9-11 illustrate examples of process efficiency achieved through concurrent feature formation with respect to the capillary oxide-vent embodiments of FIGS. 5 and 6. Referring first to FIG. 9 (depicted in the context of lateral capillary embodiment of FIG. 5, but equally applicable to vertical capillary embodiment of FIG. 6 as well as embodiments that lack capillary oxide-release passageways), the surface oxide is patterned at 441 for formation of both through-lid vents and contact vias (patterning for only one contact-via being depicted). A single etching step is then carried out at 443 to form both through-lid vents 303 and contact via trench 451, followed by a single-step deposition of a highly conductive material such as metal or highly-doped silicon at 445 to both seal the release vents (e.g., within narrow lateral passageways in the embodiment shown, or within narrow vertical passageways in the vertical capillary process) and form contact via 455. Though not specifically shown, subsequent etching and oxide deposition may be carried out to form via isolation structure (surrounding contact via 455), followed by surface contact deposition and passivation deposition to complete the MEMS device.

In the exemplary process flow of FIG. 10, a surface oxide is patterned (after oxide-release and vent-seal) at 481 to enable formation of conductive-via and via-isolation trenches, followed by single-step (concurrent or simultaneous) etching of those trenches at 483 (yielding isolation trench 488 and via trench 490). At 485, selective metal (e.g., selective tungsten or other conductive material that will deposit on silicon or polysilicon, but not oxide) is deposited concurrently (in a single deposition step) within via trench 490 and isolation trench 488, forming a conductive via 492 that extends to polysilicon region 494 and simultaneously lining the sides but not the oxide-layer stop of the via-isolation trench. The conductive isolation lining (496) may, in some embodiments, be coupled to ground or other reference potential to form a shielded conductive path through the MEMS device layers (in which case the conductive isolation 496 may electrically isolated from other regions of the MEMS device by one or more other isolation structures). As in FIG. 9, surface-contact and passivation depositions may be carried out to complete the MEMS device with the surface-contact metal isolated from via-isolation lining 496 by an oxide or other dielectric.

In the FIG. 11 process flow example, a surface oxide is patterned at 501 to enable concurrent formation of through-lid release vents 303, via-isolation trench 488 and contact-via trench 490, followed by a single-step etch to form those structures. Vapor-phase or liquid-phase oxide release (e.g., HF release) is carried out at 503 to remove (evacuate, eliminate, rid) sacrificial oxide, including the lateral-capillary oxide (leaving lateral capillary passages), vertical-passage oxide and sacrificial oxides within the MEMS cavity. At 505, a selective-metal or highly-doped silicon is deposited concurrently within the through-lid release vents, the via trench and the isolation trenches, sealing the lateral oxide-release passageways (i.e., as discussed above), forming the conductive via and isolating the via in a single material deposition step. As before, surface-contact and passivation depositions may be executed to complete the MEMS device.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, any of the specific materials, dimensions (thicknesses), concentrations, operational order (e.g., order of device fabrication steps), temperatures and the like can be different from those described above in alternative embodiments. Oxides may include various silicon oxides (e.g., silicon dioxide ($SiO_2$, silicon oxynitride ($SiO_xN_y$), etc.) and/or other dielectric materials compatible with silicon wafer processing. The term "coupled" is used herein to express a direct connection as well as a connection through one or more intervening functional components or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A semiconductor device comprising:
   a first silicon layer disposed between second and third silicon layers and separated therefrom by respective first and second oxide layers;
   a piezoelectric material layer between the second silicon layer and the third silicon layer;
   a cavity within the first silicon layer bounded by interior surfaces of the second and third silicon layers, wherein a microelectromechanical system (MEMS) resonator is disposed within the cavity;
   a passageway through the second silicon layer to enable removal of oxide from within the cavity during cavity formation, the passageway having at least one bend to prevent line-of-sight view through the second silicon layer into the cavity;
   a via which extends through the second silicon layer to provide electrical impetus to excite the piezoelectric material layer; and
   a metal feature disposed within the passageway to hermetically seal the cavity, wherein the metal feature and the via are formed from a common metal material deposited via a common deposition process.

2. The semiconductor device of claim 1 wherein the semiconductor device comprises a doped single-crystal silicon layer and a doped polycrystalline silicon layer separated from one another by the piezoelectric material layer.

3. The semiconductor device of claim 1 wherein the interior surface of the second silicon layer is disposed adjacent the first oxide layer and the passageway extends from the interior surface of the second silicon layer toward an exterior surface of the second silicon layer opposite the interior surface of the second silicon layer, and wherein the metal feature extends over the exterior surface around and into the passageway to hermetically seal the passageway.

4. The semiconductor device of claim 1 wherein the piezoelectric material layer comprises aluminum nitride.

5. The semiconductor device of claim 1 wherein the common deposition process comprises a metal sputtering process.

6. The semiconductor device of claim 1 wherein the passageway is patterned so as to provide a cross-sectional dimension of less than two microns and a depth-to-width ratio relative to a surface of the second silicon layer of greater than five.

7. The semiconductor device of claim 1 wherein the semiconductor device further comprises an electrode conductively coupled to the metal feature to provide a fixed-potential connection to the metal feature.

8. A method of fabricating a semiconductor device, the method comprising:
   forming a material stack comprising a microelectromechanical system (MEMS) resonator, the material stack having (i) a first silicon layer disposed between second and third silicon layers and separated therefrom by respective first and second oxide layers and (ii) an oxide-filled trench extending through the first silicon layer from the first oxide layer to the second oxide layer and (iii) a spezoelectric material layer between the second silicon layer and the third silicon layer and (iv) a cavity within the first silicon layer bounded by interior surfaces of the second and third silicon layers, wherein the MEMS resonator is disposed within the cavity;
   forming one or more passageways that extend through the second silicon layer to the first oxide layer, the one or more passageways being formed so as to provide at least one bend to prevent line-of-sight view through the second silicon layer into the cavity;
   forming a via which extends through the second silicon layer to provide electrical impetus to excite the piezoelectric material layer;
   wherein the method further comprises removing oxide from the oxide-filled trench and regions of the first and second oxide layers through the one or more passageways and sealing the one or more passageways with a metal feature after removing oxide from the oxide-filled trench and regions of the first and second oxide layers; and
   wherein the metal feature and the via are formed from a common metal material deposited via a common deposition process.

9. The method of claim 8 wherein forming the material stack having the oxide-filled trench that extends through the first silicon layer comprises etching a trench through the first silicon layer to define the MEMS resonator and disposing oxide within the trench, and wherein removing oxide from the oxide-filled trench and regions of the first and second oxide layer comprises removing oxide from regions adjacent the MEMS resonator to form the cavity, such that the MEMS resonator is free to move within the cavity.

10. The method of claim 8 wherein sealing the one or more passageways with metal feature comprises disposing the common metal material over a surface of the second silicon layer over openings of the one or more passageways via a sputtering process.

11. A semiconductor device comprising:
a first silicon layer disposed between second and third silicon layers and separated therefrom by respective first and second oxide layers;
a piezoelectric material layer between the second silicon layer and the third silicon layer;
a cavity within the first silicon layer bounded by interior surfaces of the second and third silicon layers, wherein a microelectromechanical system (MEMS) resonator is disposed within the cavity;
a vent that extends at least through the second silicon layer to enable material removal from within the cavity during cavity formation, the vent including first and second interconnected passageways having non-parallel axes;
a via which extends through the second silicon layer to provide electrical impetus to excite the piezoelectric material layer; and
a sealant material disposed within the second passageway to hermetically seal the cavity, wherein the sealant material and the via are formed from a common metal material deposited via a common deposition process.

12. The semiconductor device of claim 11 wherein the vent comprises a third passageway that extends from the second passageway to the cavity, in a direction orthogonal to the axis of the second passageway.

13. The semiconductor device of claim 11 wherein the vent comprises a third passageway interconnected to the first passageway by the second passageway, the third passageway extending in a direction non-coaxial to, and parallel to, the axis of the first passageway.

14. The semiconductor device of claim 11 wherein the non-parallel axes are perpendicular.

15. The semiconductor device of claim 11 wherein the piezoelectric material layer comprises aluminum nitride.

16. The semiconductor device of claim 11 wherein the common deposition process comprises a metal sputtering process.

17. The semiconductor device of claim 11 wherein the vent is patterned so as to provide a cross-sectional dimension of less than two microns and a depth-to-width ratio relative to a surface of the second silicon layer of greater than five.

18. The semiconductor device of claim 11 wherein the sealant material forms a metal feature and wherein the semiconductor device further comprises an electrode conductively coupled to the metal feature to provide a fixed-potential connection to the metal feature.

19. A method of fabricating a semiconductor device, the method comprising:
forming a material stack comprising a microelectromechanical system (MEMS) resonator, the material stack having (i) a first silicon layer disposed between second and third silicon layers and separated therefrom by respective first and second oxide layers and (ii) an oxide-filled trench extending through the first silicon layer from the first oxide layer to the second oxide layer and (iii) a piezoelectric material layer between the second silicon layer and the third silicon layer and (iv) a cavity within the first silicon layer bounded by interior surfaces of the second and third silicon layers, wherein the MEMS resonator is disposed within the cavity;
forming a vent that extends through at least the second silicon layer to the first oxide layer and that includes first and second interconnected passageways in which the second passageway is substantially narrower than the first passageway, the first and second interconnected passageways being formed so as to provide at least one bend to prevent line-of-sight view through the second silicon layer into the cavity;
forming a via which extends through the second silicon layer to provide electrical impetus to excite the piezoelectric material layer;
wherein the method further comprises removing oxide from the oxide-filled trench and regions of the first and second oxide layers through the first and second passageways of the vent to form a cavity between the second and third silicon layers, and disposing a sealant material within the second passageway to hermetically seal the cavity; and
wherein the sealant material and the via are formed from a common metal material deposited via a common deposition process.

20. The method of claim 19 wherein forming the vent comprises:
forming a third passageway that extends from the second passageway to the cavity; and
routing the second passageway along an axis substantially orthogonal to axes along which the first and third passageways are routed.

21. The method of claim 19 wherein forming the vent comprises:
forming a third passageway that is interconnected to the first passageway by the second passageway; and
routing the first and third passageways along respective axes that are parallel and non-concentric.

* * * * *

UNITED STATES PATENT AND TRADEMARK OFFICE
CERTIFICATE OF CORRECTION

PATENT NO. : 10,696,547 B2
APPLICATION NO. : 15/897135
DATED : June 30, 2020
INVENTOR(S) : Michael Julian Daneman, Charles I. Grosjean and Paul M. Hagelin Page 1 of 1

It is certified that error appears in the above-identified patent and that said Letters Patent is hereby corrected as shown below:

In the Claims

Column 8, Line 40 (Claim 8), the word "spezoelectric" should be -- piezoelectric --.

Signed and Sealed this
Twenty-fifth Day of August, 2020

Andrei Iancu
*Director of the United States Patent and Trademark Office*